United States Patent [19]

Heinonen

[11] Patent Number: 5,896,562
[45] Date of Patent: Apr. 20, 1999

[54] TRANSMITTER/RECEIVER FOR TRANSMITTING AND RECEIVING OF AN RF SIGNAL IN TWO FREQUENCY BANDS

[75] Inventor: Jarmo Heinonen, Salo, Finland

[73] Assignee: Nokia Mobile Phones, Ltd., Salo, Finland

[21] Appl. No.: 08/827,323

[22] Filed: Mar. 26, 1997

[30] Foreign Application Priority Data

Apr. 1, 1996 [FI] Finland .................................. 961465

[51] Int. Cl.$^6$ ................................................. H04B 1/50
[52] U.S. Cl. ................... 455/76; 455/86; 455/78; 455/83; 455/553
[58] Field of Search ................... 455/76, 78, 82, 455/83, 73, 88, 180.1, 183.1, 188.1, 189.1, 190.1, 324, 553; 375/219, 84, 86

[56] References Cited

U.S. PATENT DOCUMENTS

| | | | |
|---|---|---|---|
| 4,320,531 | 3/1982 | Dimon | 455/203 |
| 4,965,852 | 10/1990 | Sasaki | 455/82 |
| 5,091,919 | 2/1992 | Kuisma | 375/60 |
| 5,123,031 | 6/1992 | Kuisma | 375/60 |
| 5,448,762 | 9/1995 | Ward | 455/67.1 |
| 5,564,076 | 10/1996 | Auvray | 455/76 |
| 5,610,559 | 3/1997 | Dent | 455/76 |
| 5,715,525 | 2/1998 | Tarusawa et al. | 455/101 |
| 5,722,053 | 2/1998 | Kornfeld et al. | 455/86 |
| 5,734,970 | 3/1998 | Saito | 455/76 |

FOREIGN PATENT DOCUMENTS

| | | |
|---|---|---|
| 0581573 A1 | 2/1994 | European Pat. Off. . |
| 0594894 A1 | 5/1994 | European Pat. Off. . |
| 0653851 A3 | 5/1995 | European Pat. Off. . |
| 91819 | 4/1994 | Finland . |
| 2279519 | 1/1995 | United Kingdom . |

OTHER PUBLICATIONS

Microwave Engineering Europe, Jan. 1993, pp. 59,60,63.
Microwave Engineering Europe, May 1993, pp. 53,54,57, 58.

Primary Examiner—Nguyen Vo
Assistant Examiner—Duc Nguyen
Attorney, Agent, or Firm—Perman & Green, LLP

[57] ABSTRACT

The object of the invention is a transmitter/receiver for transmitting and receiving of an RF signal in two frequency bands. In the solution according to the invention, a transmitter/receiver is used which is based on direct conversion and in it, when operating in both frequency bands, the mixing frequency is formed by means of the same synthesizer (340). This is implemented preferably in such a way that in the higher operating frequency, the frequency of the output signal of the synthesizer is used as such as a mixing frequency and when operating in the lower operating frequency, a mixing frequency is used which is obtained by dividing the frequency of the output signal of the synthesizer by two or a larger integer in the divider (311, 361). When the solution according to the invention is used, many synthesizers are not needed in the transmitter/receiver and no intermediate frequency components are needed.

11 Claims, 4 Drawing Sheets

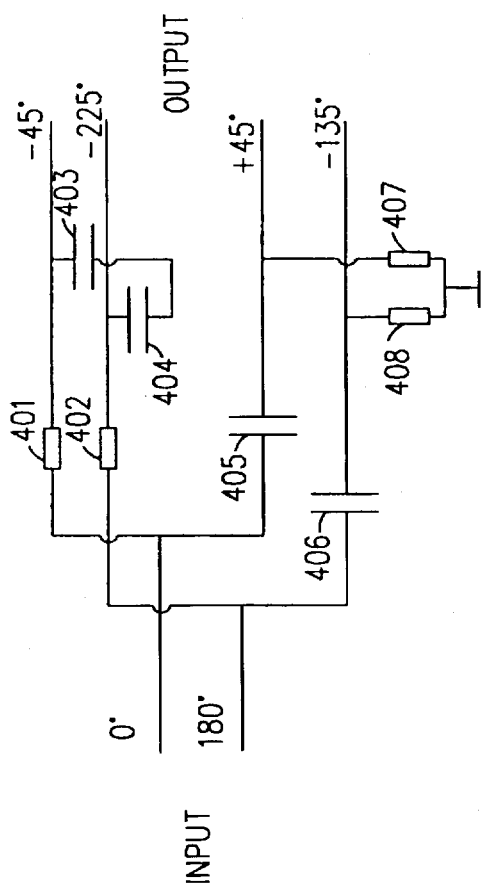
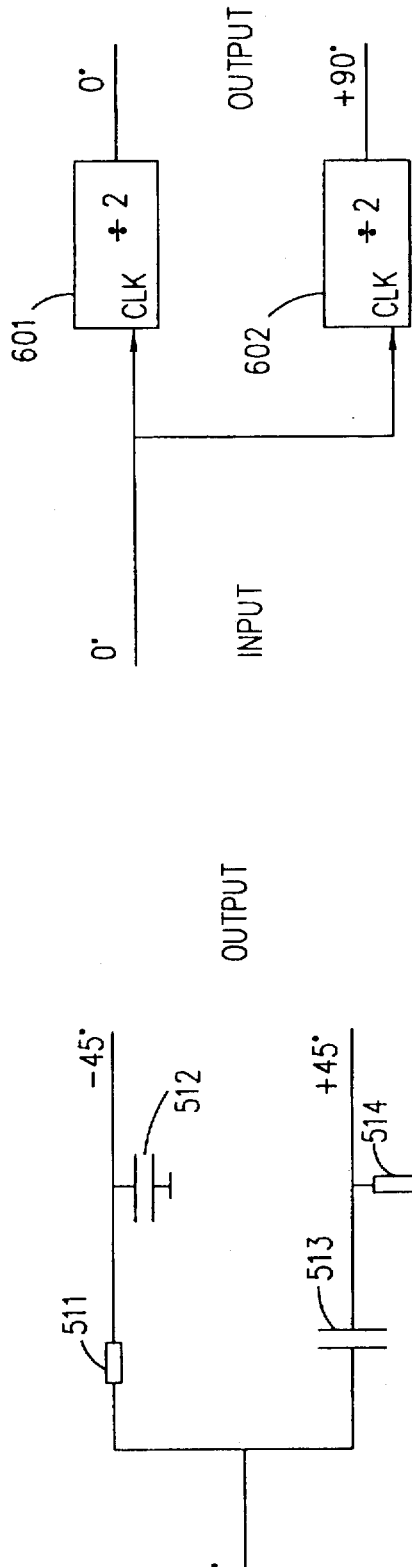
FIG. 4
FIG. 5
FIG. 6

TRANSMITTER/RECEIVER FOR TRANSMITTING AND RECEIVING OF AN RF SIGNAL IN TWO FREQUENCY BANDS

BACKGROUND OF THE INVENTION

The object of the invention is a transmitter/receiver for transmitting and receiving an RF signal in two operating frequency bands.

Mobile station systems have developed and expanded at an extremely rapid rate, which is the reason why a variety of systems using many different standards have been or are being constructed in many areas. This has generated the need for mobile stations which can use more than one system. As an example one could mention the digital GSM system and DCS that is PCN system which operate in different frequency bands but whose specifications are otherwise similar to each other.

From the published patent application EP 653851, a transmitter/receiver arrangement is known in which one local oscillator is used and its frequency has been selected between the lower operating frequency band and the higher operating frequency band in such a way that the same intermediate frequency can be used when operating in both operating frequency bands. The weak point of this solution is, however, that due to the need for these intermediate frequency stages, the implementation is extremely complicated and due to the great amount of components it requires, the manufacturing costs of such a device are high.

In a direct conversion receiver, that is in a zero intermediate frequency receiver, a radio frequency signal is converted directly to a baseband without there being any intermediate frequency. Since no intermediate frequency stages are needed, only a few components are needed in the receiver, which makes it a preferable solution for various applications. However, in mobile stations, direct conversion receivers have so far rarely been used.

FIG. 1 shows a prior known schematic block diagram of a transmitter/receiver of a mobile station and in this block diagram the receiver is a so-called direct conversion receiver. An RF signal received by an antenna 138 is conducted via a duplex filter 102 to a pre-amplifier 104. The purpose of the duplex filter is to permit the use of the same antenna both in transmitting and receiving. Instead of a duplex filter, also a synchronous antenna changeover switch can be used in a time-division system. The RF signal which is received from the amplifier 104 is low-pass pass or band pass filtered 106 and demodulated in an I/Q demodulator 108 into an in-phase signal 108a and into a quadrature signal 108b. A local oscillator signal 114b which is needed in the demodulation is received from a synthesizer 114. In block 110, removal of dc-voltage as well as automatic gain control AGC are carried out. Block 110 is controlled by a processing block 116 which may contain, for example, a microprocessor and/or a digital signal processor DSP. Automatic gain control is regulated by a signal 110a and removal of the offset voltage is regulated by a signal 110b. Signals received from block 110 are converted into digital signals in block 112 from which the signals are further transferred to digital signal processing circuits in the processing block 116.

The transmitter unit comprises an I/Q modulator 128. This takes an in-phase signal 128a and a quadrature signal 128b and creates a carrier frequency signal which is low-pass filtered and/or high-pass filtered by a filter 130. The carrier frequency signal is amplified by an RF amplifier 132 and the amplified signal is transferred via a duplex filter 102 to an antenna 138. A power control unit 134 of the transmitter controls the amplification of the RF amplifier 132 on the basis of the measured output power 136 and of the control 134a received from the processor.

FIG. 1 also shows, attached to the processing unit, a memory unit 126 and user interface means which comprise a display 118, a keyboard 120, a microphone 122 and an earpiece 124.

Practical solutions for the implementation of a direct conversion receiver have been described more closely, for example, in the following publications:

[1] Microwave Engineering Europe, January 1993, pages 59 ... 63,

[2] Microwave Engineering Europe, May 1993, pages 53 ... 59 and

[3] published patent application EP 0 594 894 AI.

FIG. 2 shows a solution for the implementation of a transmitter/receiver which operates in two frequency bands. An RF signal received by the antenna is connected either to the DCS branch or to the GSM branch of the circuit via a switch 204. If a DCS frequency band signal is being received, the received signal is conducted to a band pass filter 206, to a low noise amplifier LNA 208 and to a band pass filter 210. Thereafter, components which are separated by a phase shift of 90 degrees are formed from the signal in block 212. The in-phase component I and the quadrature component Q are conducted further by switches 214 and 234 to mixers 216 and 236. A mixing signal for the mixers is obtained from a DCS synthesizer 240, the frequency of which corresponds to the received carrier frequency and then an in-phase and a quadrature component of a complex baseband signal are obtained as a result of this mixing process. The baseband signal is processed further in a processing unit of a received signal, which means an RX signal, block 239.

Similarly, when a GSM signal is being received, the switch 204 controls the received signal to the GSM branch in which there are, respectively connected in series, a band pass filter 226, a low noise amplifier 228, a band pass filter 230 and a phase shifter 232 which forms two signals which are separated by a phase difference of 90 degrees. The signals are conducted further, controlled by the switches 214 and 234, to the mixers 216 and 236 in which a signal selected by a switch 261 and obtained from a GSM synthesizer 250 is now used as mixing frequency. Signals obtained from the mixers are conducted further to the processing unit 239 of a baseband received signal, which means an RX signal.

The DCS synthesizer is formed, as known, from a phase locked loop PLL which comprises a voltage controlled oscillator VCO 241, the output signal of which is amplified by an amplifier 246 for forming an output signal. The frequency of a signal transmitted by the oscillator 241 is divided by an integer Y in a divider 242 and the resulting signal is conducted to a phase comparator 243. Similarly, the frequency of the signal formed by a reference oscillator 258 is divided by an integer X in a divider 244 and conducted to the phase comparator 243. The phase comparator produces a signal which is proportional to the phase difference of said two input signals and which has been conducted to a low pass filter LPF 245, and the filtered signal controls further the voltage controlled oscillator 241. The above described phase locked loop operates in a known manner so that the output frequency of the synthesizer becomes locked to the frequency which is led to the phase comparator from the reference frequency branch. The output frequency is controlled by changing the dividing number Y.

The GSM synthesizer 250 comprises respectively a voltage controlled oscillator 250, an amplifier 256, dividers 252 and 254, a phase comparator 253 and a low pass filter 255. The GSM synthesizer operates in a similar way as the above described DCS synthesizer but the output frequency of the GSM synthesizer corresponds to GSM frequency bands.

In the transmitting unit, the baseband complex transmitting signal, which means the TX signal, is processed in the processing unit of a TX signal and from there the in-phase and the quadrature component of the signal are conducted to mixers 262 and 282 in which a carrier frequency signal is formed by multiplying the input signal by the mixing signal. If the DCS frequency is used in the transmission, the output signal of the DCS synthesizer is selected via a switch 261 as a mixing signal. The carrier frequency signal is conducted via a switch 264 to the DCS branch in which a phase shift of 90 degrees is formed first between the in-phase component and the quadrature component, and after this, the received signals are summed, block 266. The formed DCS signal is conducted to a band pass filter 268, to an amplifier 270 and to a band pass filter 272. The formed RF signal is conducted further to an antenna 202 via a switch 280.

If the transmission takes place in the GSM frequency band, the output signal of the GSM synthesizer is used as the mixing signal. The received carrier frequency signal is conducted to the GSM branch in which a similar processing occurs as in the DCS branch in blocks 286, 288, 290 and 292. The formed RF signal is conducted to the antenna 202 via the switch 280. To permit the use of the same antenna 202 both in transmitting and in receiving, the transmitting and the receiving circuits have to be connected to the antenna, for example, via a Duplex filter as in the arrangement shown in FIG. 1. When operating in two frequency bands, filters are needed for each frequency band. Instead of the Duplex filter, also a synchronized antenna changeover switch can be used in a time-division system.

One disadvantage of the above described circuit arrangement is that it requires the use of two synthesizers, which increases considerably the complexity and the manufacturing costs of the transmitter/receiver.

Another problem connected to the above presented solution is achieving an adequate phase accuracy. The accuracy demand for the phase difference between the I and the Q components is only of a few degrees' magnitude. Since in conventional RC phase shifters, factors on which the phase shift depends include the frequency and the temperature of the components, it is difficult to achieve an adequate phase accuracy throughout the entire frequency band and in all operating conditions. In addition, operating in two frequency bands which are far from each other complicates the controlling of the phase accuracy.

One solution is to form signals in different phases of a higher oscillator frequency by dividing the signals in which case a better phase accuracy is achieved which is independent on the frequency. The disadvantage of this solution is, however, that when operating, for example, in the 2 GHz frequency band, one would need a synthesizer with an output frequency of 4 GHz which is such a high frequency value that the implementation of the synthesizer and the frequency dividers would become extremely complicated.

SUMMARY OF THE INVENTION

The aim of the invention is to devise a simple solution for the implementation of a transmitter/receiver which operates in two frequency bands so that the above presented disadvantages connected to the solutions according to the prior art can be avoided.

One idea of the invention is to use a transmitter/receiver which is based on direct conversion and in which the mixing frequency is formed by means of the same synthesizer when operating in two frequency bands. This is implemented preferably in such a way that in the higher, first operating frequency band, the frequency of the output signal of the synthesizer is used as such as a mixing frequency and when operating in the lower, second operating frequency band, a mixing frequency is used which is obtained by dividing the frequency of the output signal of the synthesizer by at least two. When operating in the lower frequency band, two mixing signals which are separated by a phase difference of 90 degrees can be formed in the context of the dividing of the synthesizer frequency in which case no RC phase shifters in the signal line are needed and an excellent phase accuracy is achieved.

A direct conversion transmitter/receiver according to the invention which operates in two separate frequency bands and in which the first frequency band comprises the first transmitting frequency band and the first receiving frequency band and the second frequency band comprises the second transmitting frequency band and the second receiving frequency band, and in which said receiver comprises at least one RX mixer for mixing the received signal into a baseband signal, said transmitter comprises at least one TX mixer for mixing the baseband signal into a carrier frequency transmitting signal and the transmitter/receiver comprises synthesizer means for forming the first PX mixing signal to the RX mixer for mixing the signal which has been received in the first receiving frequency band into a baseband signal and for forming the first TX mixing signal to the TX mixer for mixing the first baseband TX signal into the first carrier frequency TX signal in the first transmitting frequency band, is characterized in that the transmitter/receiver comprises additionally the first conversion means for forming the second RX mixing signal from the first signal formed by said synthesizer means for mixing the signal which has been received in the second receiving frequency band to the second baseband RX signal and the second conversion means for forming the second TX mixing signal from the second signal formed by said synthesizer means for mixing the second baseband TX signal into the second carrier frequency signal in the second transmitting frequency band.

Preferable embodiments of the invention have been presented in the dependent claims.

BRIEF DESCRIPTION OF THE DRAWINGS

The invention is described in the following in more detail by means of the attached drawings in which FIG. 4 shows a circuit diagram of a solution for forming signals of different phases in RC circuits via differential signals, FIG. 5 shows a circuit diagram of a solution for forming signals of different phases in RC circuits via signals which have one terminal connected to the ground level and FIG. 6 shows a circuit diagram of a solution for forming signals of different phases at dividers.

DETAILED DESCRIPTION OF THE INVENTION

Figure 1:
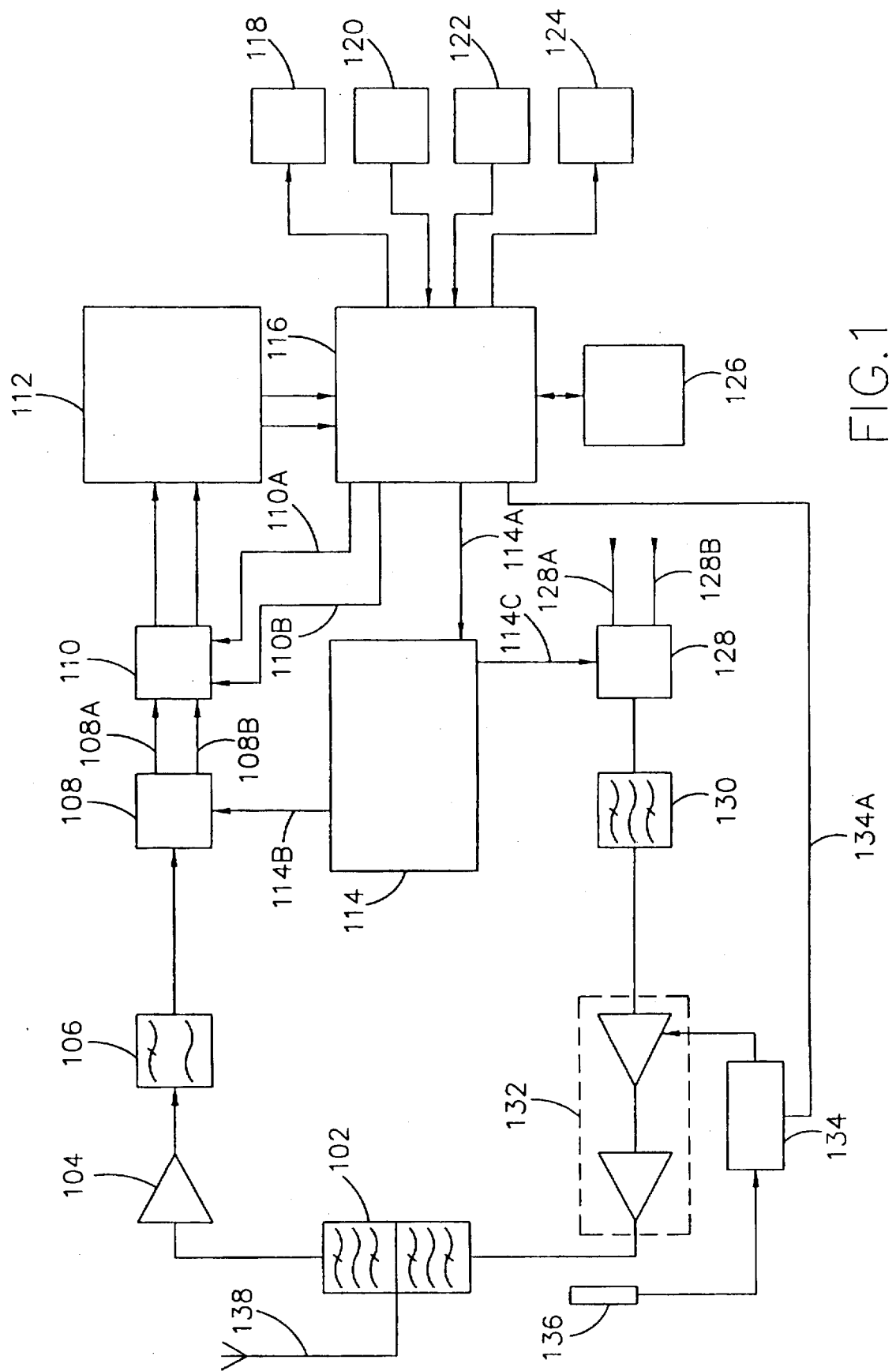
FIG. 1 shows a block diagram of a transmitter/receiver which is based on direct conversion.
Figure 2:
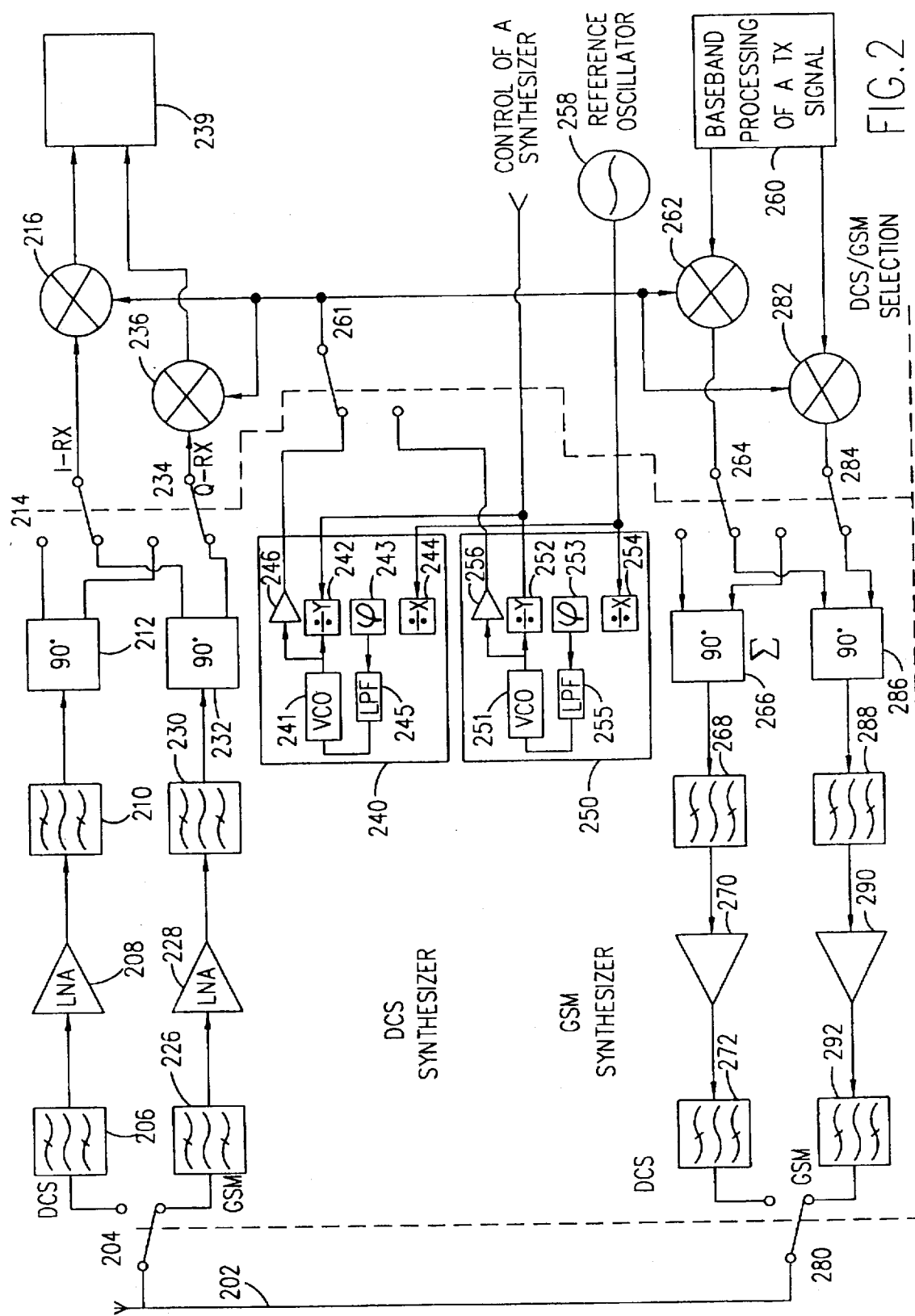
FIG. 2 shows a block diagram of a novel solution for the implementation of a transmitter/receiver which operates in two frequency bands.

FIGS. 1 and 2 were already described above. In the following, a transmitter/receiver according to the invention is described by means of FIG. 3. Finally, some possible ways of implementation for forming signals of different phases in a transmitter/receiver according to the invention are described by referring to FIGS. 4–6.

Figure 3:
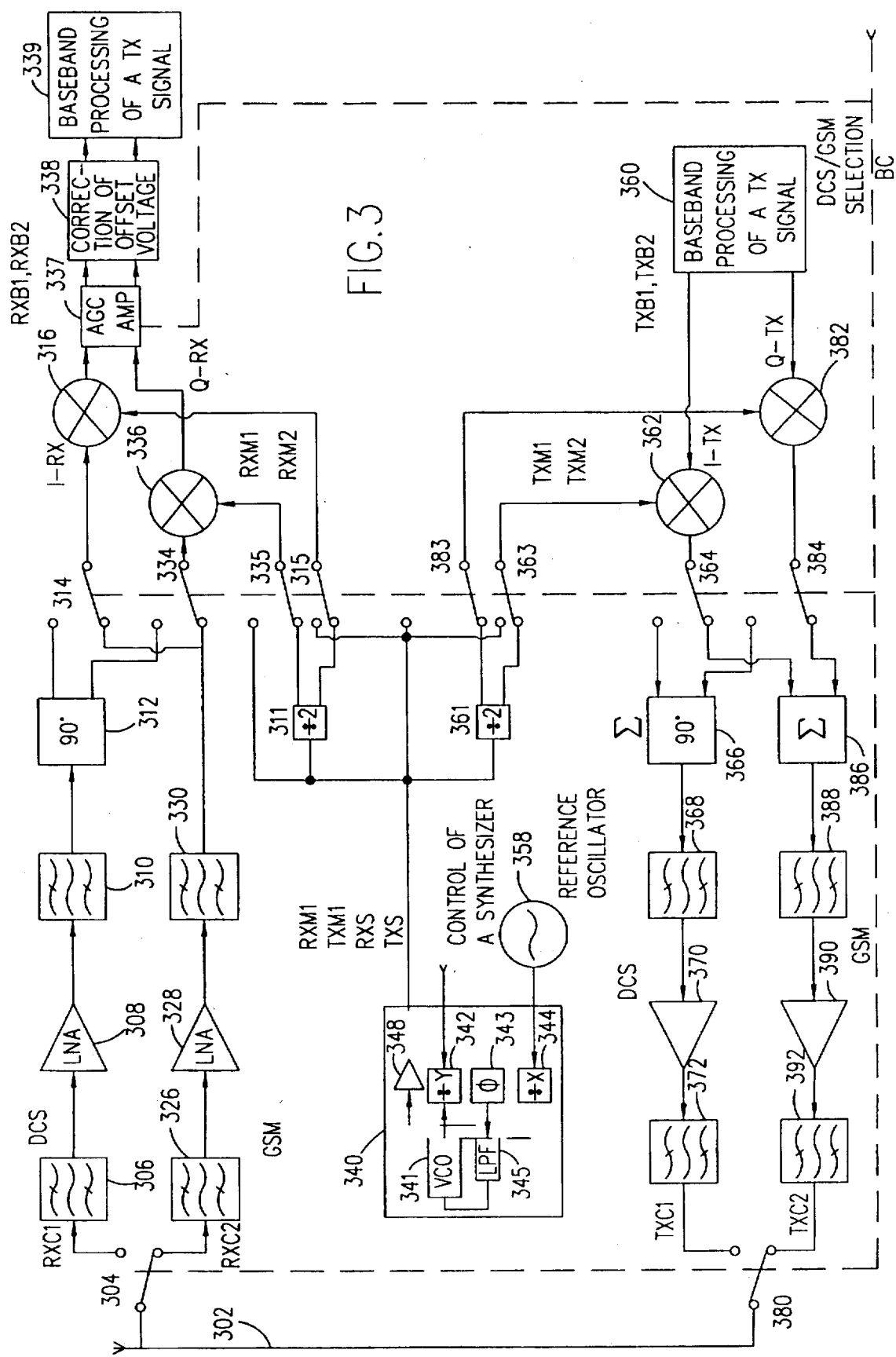
FIG. 3 shows a block diagram of a solution according to the invention for the implementation of a transmitter/receiver which operates in two frequency bands.

FIG. 3 shows a block diagram of a transmitter/receiver according to the invention. In it, an RF signal received by an antenna is connected either to the DCS branch of the circuit or to the GSM branch via a switch 304. If a DCS frequency band signal is received, the received signal is conducted to a band pass filter 306 of the DCS branch, to a low noise amplifier LNA 308 and to a band pass filter 310. After this, components which are separated by a phase shift of 90 degrees are formed from the signal in block 312. The in-phase component I and the quadrature component Q are conducted further via switches 314 and 334 to mixers 316 and 336. For the parts described above, the circuit arrangement corresponds to the circuit arrangement shown in FIG. 2.

A mixing signal for the mixers is obtained from a synthesizer 340, the frequency of which corresponds to the received carrier frequency and then, as a mixing result, an in-phase and a quadrature component of a complex baseband signal are obtained. The baseband signal is conducted further to an automatic gain control block AGC 337 and to an offset voltage correcting block 338. After this, the signal is processed further in a baseband processing unit of a received signal, which means an RX signal, block 339.

When a GSM signal is being received, the switch 304 controls the received signal to the GSM branch in which there are respectively connected in series a band pass filter 326, a low noise amplifier 328 and a band pass filter 330. Thereafter, the signal is conducted cophasal to mixers 316 and 336. The signal which is received from the synthesizer is now selected via switches 315 and 335 as a mixing frequency, and the frequency of the signal has been divided by two in block 311. In block 311, signals which are separated by a phase shift of 90 degrees are formed out of the signal to mixers 316 and 336. Thus the phase shift of 90 degrees which is needed in the mixing is not carried out to the received signal but rather to the mixing signal. A baseband complex signal which is received from the mixers is conducted further to a processing unit 339 of a baseband, received signal that is an RX signal.

The synthesizer 340 operates in a similar way as the DCS synthesizer shown in FIG. 2. It comprises thus a voltage controlled oscillator VCO 341, the output signal of which is amplified by an amplifier 346 to form an output signal. The frequency of the signal produced by an oscillator 31 is divided by an integer Y in a divider 342 and the resulting signal has been conducted to a phase comparator 343. Similarly, the frequency of a signal formed by a reference oscillator 358 is divided by an integer X in a divider 344 and is conducted to the phase comparator 343. The phase comparator produces a signal which is proportional to the phase difference of said two input signals and which has been conducted to a low pass filter 345, and the filtered signal controls further the voltage controlled oscillator 341. The output frequency is controlled by changing the dividing number Y.

In the transmitting unit, the baseband complex transmitting signal, which means the TX signal, is processed in the processing unit 360 of a TX signal and from there, the complex components of the signal are conducted to mixers 362 and 382 in which a carrier frequency signal is formed by multiplying the input signal by a mixing signal. If the DCS frequency is used in the transmitting, the output signal of the synthesizer 340 is selected as a mixing signal via switches 363 and 383. The formed DCS signal is conducted to a band pass filter 368, to an amplifier 370 and to a band pass filter 372. The formed RF signal is conducted further to an antenna 302 via a switch 380.

If the transmission occurs in the GSM frequency band, the mixing signal is formed by dividing the frequency of the output signal of the synthesizer 340 by two in the divider 361 from which mixing signals are obtained which are separated by a phase shift of 90 degrees to the first TX mixer 362 and to the second TX mixer 382. The carrier frequency signal is conducted via switches 364 and 384 to the GSM branch in which the in-phase component and the quadrature component which have been received from the mixers 362 and 382 are summed together, block 386. After this, filtering and amplification proceed in blocks 388, 390 and 392. The formed RF signal is conducted to the antenna 302 via the switch 380. In the GSM frequency, the phase shift of 90 degrees is thus processed to the mixing signal and not to the carrier frequency signal which has been obtained as a mixing result.

It should be noted that when operating in the GSM frequency band, the mixing signals of the receiving and the transmitting can be formed by means of the same frequency divider. Then the outputs of different phases of the frequency divider can be connected either to the RX mixers of the receiver during the receiving or to the TX mixers of the transmitter during the transmitting, for example, by using controllable switches. In this case, the switches are controlled by a signal which is in the first state during the time slot of the receiving and in the second state during the time slot when it is transmitting. Another option, when one divider is used, is to control the signals received from the divider to the mixers of both the transmitter and the receivers during both the transmitting and the receiving. In this case, the signals can be routed to said mixers by using a dividing means such as a power divider.

In addition, it is to be noted that instead of the described dividers, also other conversion means can be used for forming the second RX mixing frequency and the second TX mixing frequency from the signal formed by the synthesizer when operating in the second frequency band. The conversion function of the frequency can thus also be other than division by two, depending, for example, on which operating frequency bands are in use.

Change-over switches 314, 334, 315, 335, 363, 383, 364 and 384 are controlled most preferably by a two-level signal BC (Band Control). In the first level of the switch of the control signal the change-over switches are in a position in which high frequency circuits of the first frequency band are used and in the second level of the control signal the change-over switches are in a position in which high frequency circuits of the second frequency band are used. The values corresponding to the first and the second level of the control signal BC depend, among others, on the implementation of the change-over switches.

For the change-over switches 314, 334, 315, 335, 363, 383, 364 and 384, also some other known method can be applied for controlling the path of the high frequency signal.

The change-over switches can be substituted, for example, by adapter elements which are known per se, in which case when the first frequency band is used, the high frequency circuits of the second frequency band are of high impedance to the signals of the first frequency band. Similarly, when the second frequency band is used, the high frequency circuits of the first frequency band are of high impedance to the signals of the second frequency band. In this case, the high frequency circuits of different frequency bands do not cause mutual interference.

The signal BC which controls the change-over switches is formed most preferably in the processing block 116 of a mobile station, FIG. 1, which comprises preferably a processor, such as a microprocessor. The processing block 116 forms a signal on the basis of a change-over command of the system which the user has fed by using the keyboard 120, FIG. 1. The selection of the system can be, for example, menu-based in which case the desired system is chosen by a particular keystroke from the menu shown on the display 118. Then the processing block 116 forms a control signal BC which corresponds to the selected system. The change-over command of the system can also be transmitted via the mobile station system in which case the mobile station receives data which has been transmitted by another system. The received data may include a system change-over command, and on the basis of it, the processing block changes the system. Into a memory unit 126 which is attached to the processing block and which comprises preferably an EPROM or EEPROM memory, a control program has been stored which monitors the received data and as it detects a system change-over command in the data, it transmits a command to the processing block to convert the control signal BC into the state according to the selecting command.

The processing block forms additionally a control signal of a synthesizer and with this signal, a dividing number is given to the divider 342 (FIG. 3) of the frequency synthesizer, and this dividing number corresponds to the given channel frequency. Then the divider 342 of the synthesizer forms from the frequency of a voltage controlled oscillator VCO, 341, a phase comparison frequency to a phase comparator 343. For example, in the GSM system, the channel spacing is 200 kHz in which case 200 kHz is used as a phase comparison frequency.

In the solution shown in FIG. 3, the first frequency band comprises the frequency band of the DCS system and the second frequency band comprises the frequency band of the GSM system. Then the band pass range of the band pass filters 306 and 310 of the receiving branch of the first frequency band is approximately 1805–1880 MHz. The band pass range of the band pass filters 326 and 328 of the receiving branch of the second frequency band is approximately 925–960 MHz. Correspondingly, in the transmitter, the band pass range of the band pass filters 368 and 372 of the first frequency band is approximately 1710–1785 MHz and the band pass range of the band pass filters of the second frequency band is approximately 880–915 MHz.

One farther possible method for selecting the signal branch is to switch off the supply voltages from that branch which is not in use. This method can be applied both to the transmitter and to the receiver. The advantage of this alternative is that actual selecting switches are not necessarily needed.

FIG. 4 shows a circuit diagram of a solution for forming signals of different phases in the DCS receiving branch. In the circuit, differential signals are used, that is neither of the signal terminals is connected to the ground level. This circuit can be used as block 312 in the circuit arrangement of FIG. 3. In the circuit arrangement, the differential input signal comprises signal lines of 0° and −180° and for each of them a phase shift of −45° and a phase shift of +45° will be processed for forming two signals which are separated by a 90° phase shift. Phase shifters of −45° comprise resistors 401 and 402 and capacitors 403 and 404. Respectively, phase shifters of +45° comprise capacitors 405 and 406 as well as resistors 407 and 408. The advantage of this solution is that the implementation of integrated circuits is often economical when differential signals are used.

FIG. 5 shows a circuit diagram of a solution for forming signals which are separated by a 90° phase shift in an RC phase shift circuit in which one of the signal conductors is connected to the ground level. In it, the −45° phase shift is performed by a phase shifter which is formed of a resistor 511 and a capacitor 512 and the +45° phase shift is formed by a phase shifter which is formed of a capacitor 513 and a resistor 514.

Furthermore, it is to be noted that circuits according to FIGS. 4 and 5 can be used, on the basis of symmetry, also as block 366 to perform the phase shift of 90 degrees between the input signals and to sum up the received signals. Then the signals move in opposite direction in the circuits, that is the input signals are fed to the right-hand terminals of the circuits shown in the figures and the output signal is obtained from the left-hand terminals.

FIG. 6 shows a phase shifter which divides the input frequency by two and which can be used in the implementation of blocks 311 and 361. The circuit comprises two dividers 601 and 602 in which case the input signal is fed into the non-inverting input of the first divider 601 and into the inverting input of the second divider 602. This is how output signals which are separated by a phase difference of 90 degrees are formed, as known.

Mixers 362 and 382 have been shown individually in the block diagram shown in FIG. 3 but in practice they can be produced by integration to the same circuit in which case two GSM transmitting signals can be summed up, for example, in a common collector resistance of a prior known Gilbert Cell type mixer, and his collector resistance thus functions as a summer 386.

Another alternative is to have the summing up processed in a switching circuit which connects the signal after the mixers to the GSM or to the DCS branch. One preferable method is the implementation of the switches by using parallel transistor stages in which case the selection of signals proceeds, for example, by switching the supply voltage to that transistor stage through which one wishes the signal to pass and by switching the supply voltage off from that stage which one wishes to remain open. These same transistor stages can be used for summing up the signals.

A third method is to achieve the summing up by using the method shown by FIG. 3 in a separate summer which has been connected to the transmitter chain after the mixer and the GSM/DCS selecting switches.

By means of the solution according to the invention, it is possible to implement a transmitter/receiver which is considerably simpler and has lower manufacturing costs compared to the solutions according to the prior art. In the circuit arrangement according to the invention, only one synthesizer is needed and absolutely no intermediate frequency components, such as expensive intermediate frequency filters, are needed. Thus it is easy to integrate the circuit. Since no intermediate frequencies are used in the circuit, the circuit does not either cause intermediate frequency interference or become perturbed by potential external intermediate frequency interference. Thus there is less need to shield the device from interference. Additionally, by means of the invention a very accurate phase shift of 90 degrees can be achieved between the mixing signals of the lower frequency band since the phase shift is formed in the dividing circuits 311 and 361.

Some embodiments of the solution according to the invention have been presented above. Naturally the principle according to the invention can be modified within the frame of the scope of the claims, for example, by modification of the details of the implementation and ranges of use. It should be especially noted that the solution according to the invention can equally well be applied also to data transfer systems other than the above mentioned GSM and DCS/PCN systems. Similarly, the presented operating frequencies have been mentioned only as examples and the implementation of the invention is not in any way restricted to them.

What is claimed is:

1. A direct conversion transmitter/receiver which operates in two separate frequency bands, and in which the first frequency band comprises a first transmitting frequency band and a first receiving frequency band and the second frequency band comprises a second transmitting frequency band and a second receiving frequency band, and in which said receiver comprises at least one RX mixer for mixing a received signal into a baseband signal, said transmitter comprises at least one TX mixer for mixing a baseband signal into a carrier frequency transmitting signal, and the transmitter/receiver comprises synthesizer means (340) which outputs a synthesized signal for forming a first RX mixing signal (RXM1) to the RX mixer for mixing the signal (RXC1) received in the first receiving frequency band into a baseband signal (RXB1) and for forming a first TX mixing signal (TXM1) to the TX mixer (362, 382) for mixing the first baseband TX signal (TXB1) into the first carrier frequency TX signal (TXC1) which is in the first transmitting frequency band, wherein the transmitter/receiver comprises additionally:

a first conversion means (311) for forming a second RX mixing signal (RXM2) from the synthesized signal for mixing the signal received in the second receiving frequency band into a second baseband RX signal (RXB2), and a second conversion means (361) for forming a second TX mixing signal (TXM2) from the synthesized signal for mixing the second baseband TX signal (TXB2) into a second carrier frequency signal (TXC2) which is in the second transmitting frequency band.

2. A transmitter/receiver according to claim 1, characterized in that it comprises the first RX mixer (316) for forming the quadrature component of a complex baseband signal (RXB1, RXB2), the second RX mixer (336) for forming the quadrature component of a complex baseband signal (RXB1, RXB2), the first TX mixer for mixing the in-phase component of a complex baseband signal (TXB1, TXB2) into the carrier frequency and the second TX mixer for mixing the quadrature component of a complex baseband signal (TXB1, TXB2) into the carrier frequency.

3. A transmitter/receiver according to claim 1, characterized in that said first conversion means comprise the first frequency divider (311) for dividing the frequency of said first signal (RXS) by at least two and said second conversion means comprise the second frequency divider (361) for dividing the frequency of said second signal (TXS) by at least two.

4. A transmitter/receiver according to claim 3, characterized in that said first frequency divider (311) and second frequency divider (361) comprise means (311, 361) for forming two signals which are separated by a phase shift of 90 degrees.

5. A transmitter/receiver according to claim 1, characterized in that said first conversion means (311) and second conversion means (361) are at least partly the same conversion means.

6. A transmitter/receiver according to claim 3, characterized in that said first frequency divider (311) and second frequency divider (361) are the same frequency divider.

7. A transmitter/receiver according to claim 1, characterized in that it comprises the first phase shifting means (312) for forming two signals which are separated essentially by a phase shift of 90 degrees of a received signal (RXC1) which is in the first frequency band and for feeding them to the first RX mixing means (316) and to the second RX mixing means (336) for forming an in-phase and a quadrature component of a complex baseband signal as a mixing result.

8. A transmitter/receiver according to claim 7, characterized in that said first phase shifting means comprise a differential RC phase shifter.

9. A transmitter/receiver according to claim 1, characterized in that it comprises means (366) for forming a relative phase shift of 90 degrees between the first TX mixing result which is in the first transmitting frequency band and which is formed by said first mixer and the second TX mixing result which is in the first transmitting frequency and which is formed by said second mixer and means (366) for summing up said phase shifted mixing results.

10. A transmitter/receiver according to claim 1, characterized in that it comprises means (386) for summing up the first TX mixing result which is in the second transmitting frequency band and which is formed by said first mixer and the second TX mixing result which is in the second transmitting frequency and which is formed by said second mixer.

11. The use of a transmitter/receiver according to claims 1 in a GSM and/or in a DCS system.

* * * * *